US006885510B2

(12) United States Patent
Hoogland et al.

(10) Patent No.: US 6,885,510 B2
(45) Date of Patent: Apr. 26, 2005

(54) HOLOGRAPHIC STORAGE LENSES

(75) Inventors: Jan Hoogland, Dana Point, CA (US); Kevin Curtis, Longmont, CO (US)

(73) Assignee: InPhase Technologies, Inc., Longmont, CO (US)

( * ) Notice: Subject to any disclaimer, the term of this patent is extended or adjusted under 35 U.S.C. 154(b) by 0 days.

(21) Appl. No.: 10/797,075

(22) Filed: Mar. 11, 2004

(65) Prior Publication Data
US 2004/0174578 A1 Sep. 9, 2004

Related U.S. Application Data

(62) Division of application No. 10/246,737, filed on Sep. 19, 2002.
(60) Provisional application No. 60/369,343, filed on Apr. 3, 2002.

(51) Int. Cl.[7] .................................................. G02B 9/04
(52) U.S. Cl. .......................... 359/793; 359/30; 359/754; 359/796
(58) Field of Search ....................... 359/21, 29, 30, 359/1, 35, 663, 754, 793, 717, 661, 656, 708, 794, 795, 796, 725

(56) References Cited

U.S. PATENT DOCUMENTS

| 4,189,212 A | * | 2/1980 | Mizutani et al. ............ 359/680 |
| 4,707,085 A | * | 11/1987 | Takanashi et al. ........... 359/794 |
| 4,904,062 A | | 2/1990 | Morishita et al. ............ 359/708 |
| 4,932,764 A | * | 6/1990 | Simpson, Jr. ................. 359/725 |
| 4,986,641 A | | 1/1991 | Braat ............................ 359/15 |
| 5,311,364 A | | 5/1994 | Kanoshima et al. ......... 359/756 |
| 5,535,058 A | | 7/1996 | Tanaka et al. ................ 359/711 |
| 5,689,376 A | * | 11/1997 | Lewis .......................... 359/717 |
| 6,103,454 A | | 8/2000 | Dhar et al. ................... 430/290 |
| 6,104,511 A | | 8/2000 | Hesselink et al. ............. 359/22 |
| 6,252,686 B1 | | 6/2001 | Ando ............................ 359/15 |

FOREIGN PATENT DOCUMENTS

JP 2-153310 6/1990

OTHER PUBLICATIONS

Dhar, L. et al. (2000), "Photopoloymers for Digital Holographic Storage" In *Holographic Data Storage*, Coufal, H. J. eds., et al., Springer–Verlag Berlin Heidelberg. pp. 199–208.

Pepper, D. M. et al. (1990). "The Photorefractive Effect," *Scientific American* pp. 62–74.

* cited by examiner

Primary Examiner—Thong Nguyen
Assistant Examiner—Arnel C. Lavarias
(74) Attorney, Agent, or Firm—Morrison & Foerster LLP

(57) ABSTRACT

Disclosed are holographic storage systems and lenses for holographic storage systems. The lens units can be of a two-component design. The lenses can be used to both record to photorefractive storage media and to read from photorefractive storage media.

9 Claims, 14 Drawing Sheets

| Lens Figure No. | Pupil Distance (distance from lens unit to pupil in mm) | Axial Thickness of Lens Unit (in mm) | Back focal length (distance from lens unit to focal plane in mm) | Pupil location to focal plane (in mm) | Power of First Element | Power of Second Element | Field of View | Sum of the Absolute Values of Curvatures (in mm$^{-1}$) | Sum of the Value of the Curvatures (in mm$^{-1}$) | Petzval Sum | Pupil Aberration (% on Axis Pupil Radius) |
|---|---|---|---|---|---|---|---|---|---|---|---|
| 2 | 40 | 183 | 98 | 321 | .00294 | .00458 | 60 | .0229 | .0016 | -.0009 | 16 |
| 3 | 41 | 132 | 105 | 278 | .00160 | .00562 | 60 | .0430 | .0014 | -.0006 | 9 |
| 4 | 60 | 96 | 80 | 236 | .00491 | .00370 | 60 | .0512 | .0087 | -.0032 | 26 |
| 5 | 74 | 79 | 66 | 219 | .00875 | .00567 | 50 | .0525 | .0117 | -.0054 | 36 |
| 6 | 70 | 87 | 55 | 199 | .00830 | .00646 | 60 | .0510 | .0129 | -.0059 | 22 |
| 7 | 68 | 79 | 52 | 230 | .00962 | .00434 | 60 | .0552 | .0123 | -.0057 | 11 |
| 8 | 56 | 89 | 73 | 218 | .01274 | .00317 | 60 | .0595 | .0095 | -.0044 | 28 |
| 9 | 60 | 92 | 44 | 196 | .01671 | -.00219 | 60 | .0757 | .0091 | -.0040 | 17 |
| 10 | 132 | 103 | 40 | 275 | .00585 | .00133 | 52 | .0346 | .0028 | -.0013 | 1 |
| 11 | 66 | 79 | 62 | 207 | .00342 | .01000 | 60 | .0432 | .0124 | -.0057 | 28 |
| 12 | 52 | 62 | 118 | 232 | .00053 | .00711 | 70 | .0595 | .0024 | -.0011 | 22 |
| 13 | 50 | 62 | 127 | 239 | -.00043 | .00754 | 60 | .0558 | .0017 | -.0008 | 11 |

Figure 14

HOLOGRAPHIC STORAGE LENSES

FIELD OF THE INVENTION

The present invention relates to lenses suitable for holographic storage devices. More specifically this invention relates to lenses that are suitable for writing to and reading from holographic storage mediums.

BACKGROUND

Holographic storage systems are storage systems that use holographic storage media to store data. Holographic storage media includes photorefractive materials that can take advantage of the photorefractive effect described by David M. Pepper et al., in "The Photorefractive Effect," *Scientific American*, October 1990 pages 62–74. The index of refraction in photorefractive materials can be changed by light that passes through them. Holographic storage media also include photopolymers, such as those described in Coufal et al., "Photopolymers for Digital Holographic Storage" in HOLOGRAPHIC DATA STORAGE, 199–207 (2000), and photochromatic materials. By controllably changing the index of refraction in such materials, high-density, high-capacity, and high-speed storage of information in holographic storage media can be accomplished.

In the typical holographic storage system, two coherent light beams are directed onto a storage medium. The first coherent light beam is a signal beam, which is used to encode data. The second coherent light beam is a reference light beam. The two coherent light beams intersect within the storage medium to produce an interference pattern. The storage medium records this interference pattern by changing its index of refraction to form an image of the-interference pattern.

The recorded information, stored as a holographic image, can be read by illuminating the holographic image with a reference beam. When the holographic image is illuminated with a reference beam at an appropriate angle, a signal beam containing the information stored is produced. Most often the appropriate angle for illuminating the holographic image will be the same as the angle of the reference beam used for recording the holographic image. More than one holographic image may be stored in the same volume by, for example, varying the angle of the reference beam during recording.

Varying the angle of the reference beam during recording to store multiple holographic images in the same volume is called angle multiplexing. In addition to angle multiplexing, other techniques for storing multiple holograms in the same volume include wavelength multiplexing, phase code multiplexing, correlation multiplexing, shift multiplexing, aperture multiplexing, and fractal multiplexing. Since the same volume can be used to store multiple holographic recordings, high storage capacities can be obtained using holographic storage systems.

Information can be encoded within the signal beam in a variety of ways. One way of encoding information into a signal beam is by using an electronic mask, called a spatial-light modulator (SLM). Typically, a SLM is a two dimensional matrix of pixels. Each pixel in the matrix can be directed to transmit or reflect light, corresponding to a binary 1, or to block light, corresponding to a binary 0. The signal beam, once encoded by the SLM, is relayed onto the storage medium, where it intersects with a reference beam to form an interference pattern. The interference pattern records the information encoded in the signal beam to the holographic storage medium.

The information recorded in the holographic storage medium is read by illuminating the storage medium with a reference beam. The resulting signal beam is then typically imaged onto a sensor, such as a Charge Coupled Device (CCD) array or an CMOS active pixel sensor. The sensor is attached to a decoder, which is capable of decoding the data.

A holographic storage medium includes the material within which a hologram is recorded and from which an image is reconstructed. A holographic storage medium may take a variety of forms. For example, it may comprise a film containing dispersed silver halide particles, photosensitive polymer films ("photopolymers") or a freestanding crystal such as iron-doped $LiNbO_3$ crystal. U.S. Pat. No. 6,103,454, entitled RECORDING MEDIUM AND PROCESS FOR FORMING MEDIUM, generally describes several types of photopolymers suitable for use in holographic storage media. The patent describes an example of creation of a hologram in which a photopolymer is exposed to information carrying light. A monomer polymerizes in regions exposed to the light. Due to the lowering of the monomer concentration caused by the polymerization, monomer from darker unexposed regions of the material diffuses to the exposed regions. The polymerization and resulting concentration gradient creates a refractive index change forming a hologram representing the information carried by the light.

FIG. 1 illustrates the basic components of a holographic system 100. System 100 contains a SLM 112, a holographic storage medium 114, and a sensor 116. SLM 112 encodes beam 120 with an object image. The image is stored by interfering the encoded signal beam 120 with a reference beam 122 at a location on or within holographic storage medium 114. The interference creates an interference patterns (or hologram) that is captured within medium 114 as a pattern of, for example, a holographic refractive index grating.

It is possible for more than one holographic image to be stored at a single location, or for a holographic image to be stored at a single location, or for holograms to be stored in overlapping positions, by, for example, varying the angle, the wavelength, or the phase of the reference beam 122, depending on the particular reference beam employed. Signal beam 120 typically passes through lenses 130 before being intersected with reference beam 122 in the medium 114. It is possible for reference beam 122 to pass through lenses 132 before this intersection. Once data is stored in medium 114, it is possible to retrieve the data by intersecting a reference beam 122 with medium 114 at the same location and at the same angle, wavelength, or phase at which a reference beam 122 was directed during storage of the data. The reconstructed data passes through one or more lenses 134 and is detected by sensor 116. Sensor 116, is for example, a charged coupled device or an active pixel sensor. Sensor 116 typically is attached to a unit that decodes the data.

Typically, lenses 130 comprise a complicated Fourier Transform lens arrangement. A Fourier Transform lens arrangement 134 is then used to transform the signal beam back into its original form during the read phase. Fourier transform lens systems use multiple lens elements to focus the signal beam onto the holographic storage medium during the recording phase and to focus the signal beam from the holographic storage medium during the read phase. Typically, from eight to twelve lens elements are used to focus the signal beams in this manner. The large number of lenses increases the size, weight, and cost of a holographic storage system. Further, using a large number of lenses requires very tight tolerances on the design and arrangement of the lens elements. These constraints limit the commercial suitability of a holographic storage system.

U.S. Pat. No. 6,104,511, discusses some of the problems with conventional multi-element Fourier Transform lenses used for holographic storage units. The series of lenses are replaced by a concave and convex reflectors. However, multiple complex reflectors are still used to perform a complicated Fourier Transform of the image data.

SUMMARY OF THE INVENTION

Disclosed are holographic recording systems, holographic retrieval systems and lenses suitable for holographic recording and retrieval systems. Preferably, the lenses have a small pupil aberration, a flat field of view, a large field of view, a long pupil distance, and a long back focal length.

In one embodiment, the holographic recording system comprises an encoding device, a storage medium and a two-component lens unit placed between the encoding device and the storage medium. The two-component lens unit directs a signal beam encoded by the encoding device onto a pupil plane positioned at the storage medium. The two-component lens unit has a pupil aberration that is less than 40% of the on axis pupil radius.

Preferably, the encoding device is a spatial-light modulator. Preferably, the two component lens unit is telecentric. Preferably, the two-component lens unit comprises at least one material with a refractive index greater than 1.6. Preferably, the two-component lens unit has a pupil distance of 30% of EFL to 140% of EFL. Preferably, the two-component lens unit has an axial vertex length of between 45% and 195% of EFL.

Preferably, the two component lens unit has a back focal length of between 30% and 140% of EFL. Preferably, the two-component lens unit has a Petzval curvature between $-0.007$ mm$^{-1}$ and $0.001$ mm$^{-1}$ when the two-component lens unit is scaled to have an effective focal length of 100 mm. Preferably, the two-component lens unit has a field-of-view between 45 degrees and 75 degrees. Preferably, the two-component lens unit has an F-number between 4.0 to 16.0.

In another embodiment, the holographic retrieval system comprises a storage medium, a sensor and a two-component lens unit placed between the sensor and the storage medium. The two-component lens unit focuses a signal beam emanating from the storage medium onto the sensor. The two-component lens unit has a pupil aberration that is less than 40% of the on axis pupil radius.

Preferably, the two component lens unit is telecentric. Preferably, the two-component lens unit comprises at least one material with a refractive index greater than 1.6. Preferably, the two-component lens unit has a pupil distance of 30% of EFL to 140% of EFL. Preferably, the two-component lens unit has an axial vertex length of between 45% and 195% of EFL.

Preferably, the two component lens unit has a back focal length of between 30% and 140% of EFL. Preferably, the two-component lens unit has a Petzval curvature $-0.007$ mm$^{-1}$ and $0.001$ mm$^{-1}$ when the two-component lens unit is scaled to have an effective focal length of 100 mm. Preferably, the two-component lens unit has a field-of-view between 45 degrees and 75 degrees. Preferably, the two-component lens unit has an F-number between 4.0 to 16.0.

In yet another embodiment, the two-component lens unit comprises a first lens component and a second lens component. The two-component lens unit has a pupil distance that is at least 30% of EFL, a back focal length that is at least 30% of EFL, and a meniscus shaped lens element with an optical power of between $-0.003$ and $0.011$ when scaled to an EFL of 100 mm.

Preferably, the two component lens unit is telecentric. Preferably, the two-component lens unit comprises at least one material with a refractive index greater than 1.6. Preferably, the two-component lens unit has a pupil distance that is less than 140% of EFL. Preferably, the two-component lens unit has an axial vertex length of between 45% and 195% of EFL.

Preferably, the two component lens unit has a back focal length of less than 140% of EFL. Preferably, the two-component lens unit has a Petzval curvature $-0.007$ mm$^{-1}$ and $0.001$ mm$^{-1}$ when the two-component lens unit is scaled to have an effective focal length of 100 mm. Preferably, the two-component lens unit has a field-of-view between 45 degrees and 75 degrees. Preferably, the two-component lens unit has an F-number between 4.0 to 16.0.

BRIEF DESCRIPTION OF THE DRAWINGS

The invention will be better understood by reference to the Detailed Description of the Invention when taken together with the attached drawings, wherein:

FIG. 14 is a table containing characteristics of the lenses in FIGS. 2–14.

DETAILED DESCRIPTION OF THE INVENTION

Figure 1:
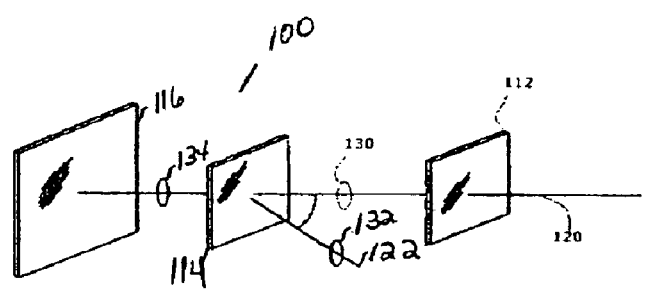
FIG. 1 is a holographic storage and retrieval system.

Described are simple and accurate lenses that can be used for holographic storage devices. The lenses need not be capable of forming an accurate Fourier Transformation of the signal beam from the encoding device, which allows for a more compact and less complex lens system.

In a preferred embodiment, the lens unit is a two-component lens. A lens component is a single lens element, or two or more lens elements which are all held together in optical contact. In a preferred two-component lens design an air space is provided between the two lens components.

Preferably, each lens component has only one lens element, not including any aspherical caps formed on the lens elements. An aspherical cap is a lens piece that is formed on a lens element. Since the cap is formed on a lens element, and is not a separate piece, an aspherical cap is not considered a separate lens element.

In holographic storage systems, typically information is encoded into the signal beam using a two dimensional encoding device. A preferable type of encoding device is a SLM. A typical SLM is a matrix of squares that have a height and a width, but negligible thickness. Light travels through or is reflected by the SLM and is encoded by this two dimensional pattern. The encoded light is directed onto a photorefractive crystal where the SLM pattern is stored. When the stored pattern is read, the recorded SLM pattern is preferably focused onto a detecting device in its original flat form. A preferable detecting device is a CCD array or a CMOS sensor array.

The same lens unit can be used for both recording and reading or a separate lens unit may be used for recording and reading. The lens units need not be capable of accurately Fourier Transforming the encoded signal beam, but preferably any changes made to the signal beam by a lens unit during the recording phase, is reversed by a lens unit during the read phase.

While an exact Fourier Transform is not needed at the storage material plane, preferably pupil aberration is controlled. An enlargement of the pupil due to pupil aberration typically results in an increase in the size of the hologram needed to capture all of the light for reconstruction of the image. As the recording volume is preferably kept as small as possible, the amount of pupil aberration is preferably kept small. The pupil aberration for telecentric lenses is defined as the largest deviation of any ray in the pupil plane of light that is part of a fixed solid angle centered around the parallel chiefray of any field point. It is expressed in a percentage of the on-axis pupil radius.

Preferably pupil aberration is less than 40%. More preferably pupil aberration is less than 20%. Most preferably pupil aberration is less than 10%.

Since information in a holographic storage system is typically encoded and decoded in two-dimensional form, a lens unit used in a holographic storage system preferable has a flat field-of-view. A flat field-of-view means that the lens unit is able to focus in a sufficiently flat plane over its field-of-view. A flatter plane allows for more precise storage and retrieval of information in a holographic storage system.

The flatness of the field-of-view is related to the Petzval curvature as the Petzval curvature is the third order approximation of the field curvature. A lens unit with a flat field-of-view typically has a small Petzval curvature.

The Petzval curvature can be calculated according to the formula:

$$C_p = \frac{n_2 - n_1}{n_2 \cdot n_1 \cdot r_1} + \frac{n_3 - n_2}{n_3 \cdot n_2 \cdot r_2} + \ldots$$

Where $C_P$ equals the Petzval curvature and $r_1, r_2, \ldots$ are the radii of each surface and aspherical caps in the lens unit, and $n_1, n_2 \ldots$ their respective refractive indices before and after $r_1$. The Petzval curvature is standardized by scaling the lens unit to have a focal length of 100 mm.

Preferably, the Petzval curvature of the lens unit is between $-0.007$ mm$^{-1}$ and $0.001$ m$^{-1}$. More preferably, the Petzval curvature of the lens unit is between $-0.005$ mm$^{-1}$ and $0$ mm$^{-1}$. Most preferably, the Petzval curvature of the lens unit is between $-0.003$ mm$^{-1}$ and $-0.001$ mm$^{-1}$.

It follows from the above formula for calculating Petzval curvature that if the refractive indices of the lens elements in the lens unit are the same, obtaining a Petzval sum close to zero requires that the sum of the curvatures (the inverse of the radius of each lens element) be close to zero.

In a two-component lens unit, with an air gap provided between the lens components there are three preferred ways of reducing the Petzval curvature. The first way of reducing the Petzval curvature is to use lens materials having a high refractive index. The second way of reducing the Petzval curvature is to increase the size of the air gap between optical components to increase the optical power of the lens unit instead of increasing the power of the individual lens components. The third way of reducing the Petzval curvature is to use a relatively thick meniscus shaped lens element in the lens unit.

In one aspect of the invention, the lens unit has at least one element made of a material that has a refractive index greater than about 1.6. More preferably, the lens unit has at least one element made of a material that has a refractive index greater than about 1.7. Most preferably, the lens unit has at least one element made of a material that has a refractive index greater than about 1.8.

The power of a lens component is the reciprocal of the focal length of the lens component. Accordingly, the larger the power of a lens, the smaller the focal length. The power of a single lens component is also related to the Petzval curvature of the lens component. The larger the power of a lens, the larger the Petzval curvature. In a two-component design, the Petzval curvature of the lensunit increases as the Petzval curvature of the individual lens components increase.

A preferred lens unit with a small Petzval curvature can also be produced by using one lens component with a positive power and one lens component with a negative power. When the powers of the two lens components have opposite signs, the Petzval curvature of one component can cancel part or all of the Petzval curvature of the other lens component, leading to a lower combined Petzval curvature.

Increasing the optical power of the lens system is typically desired because a higher optical power, assuming a constant field size, can result in a smaller overall size for the optical system. The angular field size increases with an increase of the optical power of the lens unit.

Preferably, the lens unit's angular field coverage is at least 40 degrees. More preferably, the lens unit's power is at least 50 degrees. Most preferably, the lens unit's power is at least 60 degrees.

In a two-component system that has an air gap between the lens components, the power of the lens unit can be increased in two preferred manners. First, the power of the lens unit can be increased by increasing the power of the individual lens components. However, in addition to increasing the power of the lens unit, increasing the power of the individual lens components can increase the Petzval curvature of the lens unit.

Preferably, the lens unit has a meniscus shaped lens element with a power between $-0.003$ mm$^{-1}$ and $0.011$ mm$^{-1}$ when scaled to an EFL of 100 mm. More preferably, the lens unit has a meniscus shaped lens element with a power between $-0.002$ mm$^{-1}$ and $0.008$ mm$^{-1}$ when scaled to an EFL of 100 mm. Most preferably, the lens unit has a meniscus shaped lens element with a power between $-0.001$ mm$^{-1}$ and $0.005$ mm$^{-1}$ when scaled to an EFL of 100 mm.

The second way of increasing the power of the lens unit is to increase the distance between a surface of positive power and a surface of negative power. Increasing the thickness of a meniscus element or the air gap between lens components of opposite powers may be used to increase the power of the unit without increasing the Petzval curvature of the lens unit.

The air gap between the, lens components is preferably balanced with forming a compact lens unit. The axial vertex length is defined as the axial distance from the lens surface on one end of the lens unit to the lens surface on the opposite end of the lens unit. Preferably, the axial vertex length of the lens unit is between about 45% and about 195% of the effective focal length (EFL). More preferably, the axial vertex length of the lens unit is between about 50% and about 165% of the EFL. Most preferably, the axial vertex length of the lens unit is between about 55% and about 135% of the EFL.

In another aspect of the invention, the lens unit has at least one meniscus shaped element. Preferably, the lens unit has at least one meniscus shaped lens element with an axial thickness of between about 20% and about 110% of the effective focal length (EFL). More preferably, the lens unit has at least one meniscus shaped element with an axial thickness of between about 25% and about 60% of the EFL. Most preferably, the lens unit has at least one meniscus shaped element with an axial thickness of between about 30% and about 50% of the EFL.

The lens unit may have spherical aberration. This can adversely affect the image quality of the lens unit. As the number of parameters in a two-component lens are very limited, preferably, the spherical aberration of the lens unit is corrected using an aspheric surface. The aspheric surface may be created by molding or polishing the surface of one of the lens elements or the aspheric surface may formed as an aspheric cap and applied onto a spherical lens element surface.

Preferably, the lens unit provides a large field-of-view. A larger field-of-view for the lens unit during the recording phase allows for a larger SLM area to be encoded and recorded at one time. Correspondingly, a larger field-of-view for the lens unit during the reading phase allows a larger area of encoded information to be projected from the holographic storage medium onto a sensor for decoding at one time.

Preferably, the lens unit has a field-of-view of between about 45 degrees and about 75 degrees. More preferably, the lens unit has a field-of-view of between about 50 degrees and about 70 degrees. Most preferably, the lens unit has a field-of-view between about 55 degrees and about 65 degrees.

Preferably, the lens unit is telecentric. A telecentric lens maintains a near zero chiefray angle at the focal plane over the full field of view. A change in the image geometry during focusing is thus reduced or eliminated.

The F-number of the lens unit relates to the maximum resolution obtainable by the lens unit. A lower F-number allows for the lens unit to provide a higher resolution. A higher resolution allows for more precise holographic storage and reading and/or allows more data to be stored in the same amount of space. Preferably, the F-number is less than about 16.0. More preferably, the F-number is less than about 11.0. Most preferably, the F-number is less than about 8.0.

Typically, lowering the F-number of a lens unit involves more optical correction and a more complex lens unit. Since more complex lens units are more difficult to align and manufacture, preferably the lens unit has an F-number greater than about 4.0. More preferably, the lens unit has an F-number greater than about 5.0. Most preferably, the lens unit has an F-number great than about 6.0.

Preferably, the lens unit has an outside pupil location with a large clearance. The pupil distance is the distance from the lens unit to this location. Preferably, the pupil location is chosen as the recording area to minimize the amount of space used for storage. The recording area may need to be accessible, to allow for placement of the recording medium at the recording area location and to allow for placement of a reference beam which interests with the storage beam at the recording area. Accordingly, preferably the pupil location has a relatively large clearance from the lens unit.

Preferably, the lens unit has a pupil distance that is about 30% to about 140% of the EFL. More preferably, the lens unit has a pupil distance that is about 40% to about 120% of the EFL. Most preferably, the lens unit has a pupil distance that is about 50% to about 100% of the EFL.

The lens preferably has a long back focal length. The back focal length is the distance between the information being encoded and the lens unit. In one embodiment, illumination light, which forms the signal beam, illuminates a SLM on a face towards the lens unit. In this embodiment, the illumination light illuminates the SLM, the SLM encodes the illumination light to form the signal beam, and then the SLM reflects the encoded signal beam to the lens unit. The lens unit then directs the signal beam onto the holographic storage medium, where the encoded signal beam is recorded. In this arrangement, the back focal length must be large enough to allow sufficient illumination light between the lens unit and the SLM. During the reading phase, the back focal length is the location of the sensor.

Preferably, the back focal length is from about 30% of the EFL to about 140% of the EFL. More preferably, the back focal length of the lens unit is from about 40% of the EFL to about 125% of the EFL. Most preferably, the back focal length is from about 50% of the EFL to about 110% of the EFL.

The present invention will be better understood with reference to the following examples, shown in FIGS. 2–13 and Table 1. These examples are intended to illustrate specific embodiments within the overall scope of the invention as claimed.

EXAMPLE 1

Figure 2:
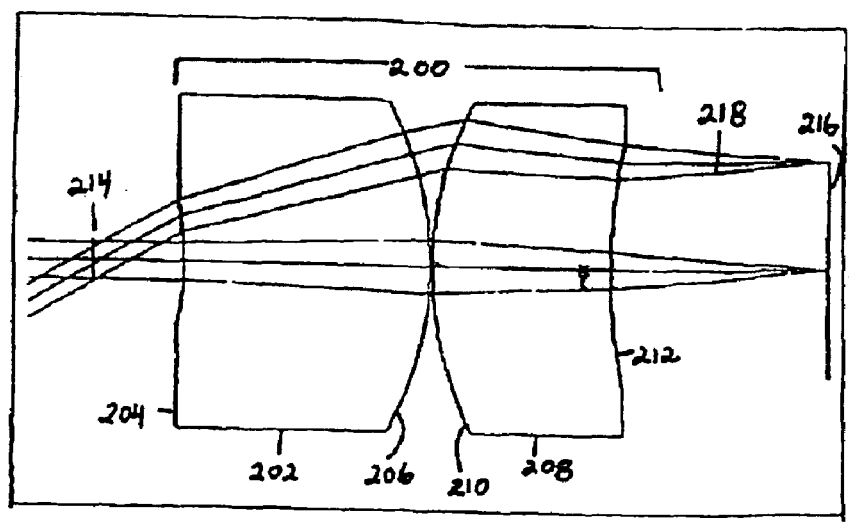
FIG. 2 is a lens unit according to the present invention.

FIG. 2 shows a two-component lens unit 200. Lens unit 200 includes a first lens component 202 and a second lens component 208. The first lens component 202 is made from Cleartran®, a lens material available from Rohm and Haas. First lens component 202 has a first outside surface 204 and a second outside surface 206. Second lens component 208 is also made from Cleartran®. Second lens component 208 has a first outside surface 210 and a second outside surface 212.

Image plane 216 is where the encoding device is placed during recording and where the sensor is placed during reading. Pupil location 214 is where the recording medium is placed for both recording and reading. Light rays 218 go from image plane 216 towards pupil location 214 during the recording phase and from pupil location 214 towards image plane 216 during the reading phase.

Lens unit 200 has an effective focal length of 100.0, an F-number of 6.0, and a field-of-view of 60 degrees. The overall length of the holographic storage system from pupil location 214 to image plane 216 is 321 mm. The distance from the pupil location 214 to the vertex of the first outside surface 204 is 40 mm. The thickness of the lens unit from the vertex of surface 204 to the vertex of surface 212 is 183 mm. The distance from the vertex of surface 212 to image plane 216 is 98 mm. The characteristics of lens unit 200 are summarized in Table 1.

TABLE 1

Lens Unit 200
Effective Focal Length (EFL) = 100.0 mm
Field of view 2ω = 60 deg
F-number: 6.0    Overall length: 321 mm
(distance from pupil location to image plane)

| Position on FIG. 2 | Radius of curvature R (mm) | Central thickness/ airspace t* (mm) | Lens Material |
|---|---|---|---|
| 214 | 0.0 | 40.0 (y = 214, x = 204) | |
| 204 | −136.0 | 105.0 (y = 204, x = 206) | Cleartran ® |
| 206 | −153.0 | 1.0 (y = 206, x = 210) | |
| 210 | 174.0 | 77.0 (y = 210, x = 212) | Cleartran ® |
| 212 | 303.3 | 97.5 (y = 212, x = 216) | |
| 216 | 0 | | |

*t = distance between positions y and x, wherein x and y are positions in FIG. 2.

EXAMPLE 2

Figure 3:
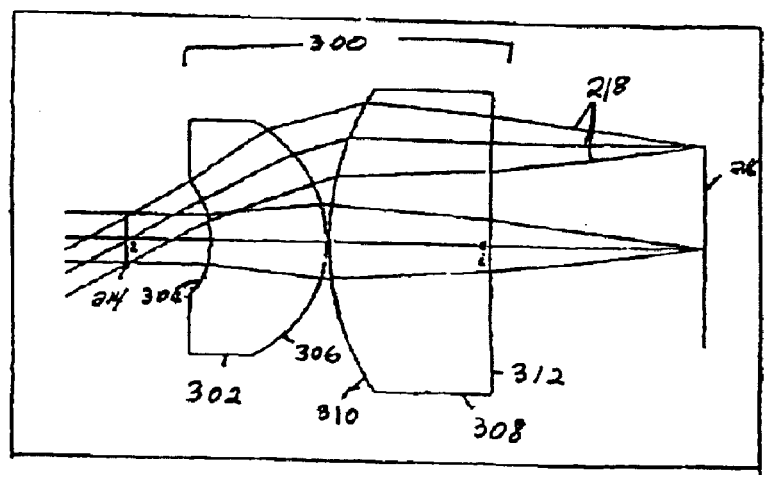
FIG. 3 is another lens unit according to the present invention.

FIG. 3 shows a two-component lens unit 300. Lens unit 300 includes a first lens component 302 and a second lens component 308. The first lens component 302 is made from SF6, a material available from Schott Glass Technologies, Inc. First lens component 302 has a first outside surface 304 and a second outside surface 306. Second lens component 308 is also made from SF6. Second lens component 308 has a first outside surface 310 and a second outside surface 312.

Lens unit 300 has an effective focal length of 100.0 mm, an F-number of 4.0, and a field-of-view of 60 degrees. The overall length of the holographic storage system from pupil location 214 to image plane 216 is 278 mm. The distance from the pupil location 214 to the vertex of the first outside surface 304 is 41 mm. The thickness of the lens unit from the vertex of surface 304 to the vertex of surface 312 is 132 mm. The distance from the vertex of surface 312 to image plane 216 is 105 mm. The characteristics of lens unit 300 are summarized in Table 2.

TABLE 2

Lens Unit 300
Effective Focal Length (EFL) = 100.0 mm
Field of view 2ω = 60 deg
F-number: 4.0    Overall length: 278 mm
(distance from pupil location to image plane)

| Position on FIG. 3 | Radius of curvature R (mm) | Central thickness/ airspace t* (mm) | Lens Material |
|---|---|---|---|
| 214 | 0.0 | 41.0 (y = 214, x = 304) | |
| 304 | −49.3** | 54.0 (y = 304, x = 306) | SF6 |
| 306 | −67.0 | 1.0 (y = 306, x = 310) | |
| 310 | 137.0** | 77.0 (y = 310, x = 312) | SF6 |
| 312 | 1950.0 | 104.8 (y = 312, x = 216) | |
| 216 | 0 | | |

*t = distance between positions y and x, wherein x and y are positions in FIG. 3.
**The aspheric coefficients are:
Surface 304: k = 0.51 a4 = −1.0e-7 a6 = −2.0e-11
Surface 310: k = −0.53

EXAMPLE 3

Figure 4:
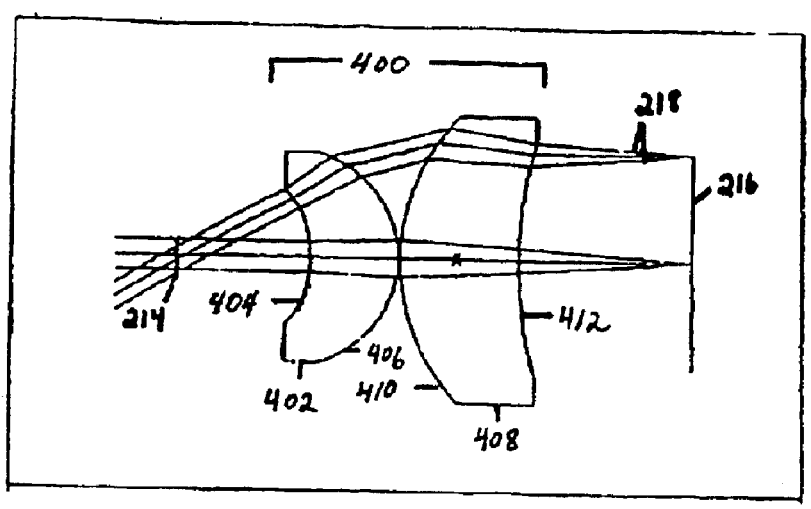
FIG. 4 is another lens unit according to the present invention.

FIG. 4 shows a two-component lens unit 400. Lens unit 400 includes a first lens component 402 and a second lens component 408. The first lens component 402 is made from polystyrene. First lens component 402 has a first outside surface 404 and a second outside surface 406. Second lens component 408 is also made from polystyrene. Second lens component 408 has a first outside surface 410 and a second outside surface 412.

Lens unit 400 has an effective focal length of 100.0 mm, an F-number of 7.0, and a field-of-view of 60 degrees. The overall length of the holographic storage system from pupil location 214 to image plane 216 is 236 mm. The distance from the pupil location 214 to the vertex of the first outside surface 404 is 60 mm. The thickness of the lens unit from the vertex of surface 404 to the vertex of surface 412 is 96 mm. The distance from the vertex of surface 412 to image plane 216 is 80 mm. The characteristics of lens unit 400 are summarized in Table 3.

TABLE 3

Lens Unit 400
Effective Focal Length (EFL) = 100.0 mm
Field of view 2ω = 60 deg
F-number: 7.0    Overall length: 236 mm
(distance from pupil location to image plane)

| Position on FIG. 4 | Radius of curvature R (mm) | Central thickness/ airspace t* (mm) | Lens Material |
|---|---|---|---|
| 214 | 0.0 | 60.0 (y = 214, x = 404) | |
| 404 | −62.3** | 40.0 (y = 404, x = 406) | polystyrene |
| 406 | −51.0 | 1.0 (y = 406, x = 410) | |
| 410 | 97.0 | 55.0 (y = 410, x = 412) | polystyrene |
| 412 | 193.0 | 79.7 (y = 412, x = 216) | |
| 216 | 0 | | |

*t = distance between positions y and x, wherein x and y are positions in FIG. 3.
**The aspheric coefficients are:
Surface 404: k = 2.05 a4 = −5.3e-7 a6 = −2.0e-10

EXAMPLE 4

Figure 5:
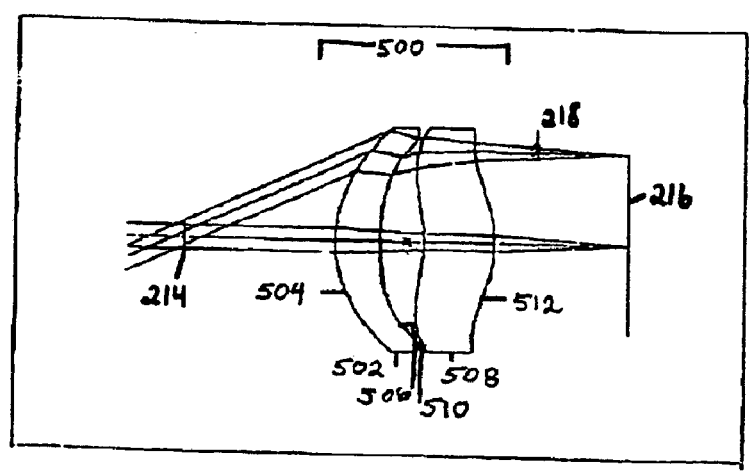
FIG. 5 is another lens unit according to the present invention.

FIG. 5 shows a two-component lens unit 500. Lens unit 500 includes a first lens component 502 and a second lens component 508. The first lens component 502 is made from SFL57, a lens material available from Schott Glass Technologies, Inc. First lens component 502 has a first outside surface 504 and a second outside surface 506. Second lens component 508 is also made from SFL57. Second lens component 508 has a first outside surface 510 and a second outside surface 512.

Lens unit 500 has an effective focal length of 100.0 mm, an F-number of 8.0, and a field-of-view of 50 degrees. The overall length of the holographic storage system from pupil location 214 to image plane 216 is 219 mm. The distance from the pupil location 214 to the vertex of the first outside surface 504 is 74 mm. The thickness of the lens unit from the vertex of surface 504 to the vertex of surface 512 is 79 mm. The distance from the vertex of surface 512 to image plane 216 is 66 mm. The characteristics of lens unit 500 are summarized in Table 4.

TABLE 4

Lens Unit 500
Effective Focal Length (EFL) = 100.0 mm
Field of view 2ω = 50 deg
F-number: 8.0   Overall length: 321 mm
(distance from pupil location to image plane)

| Position on FIG. 5 | Radius of curvature R (mm) | Central thickness/ airspace t* (mm) | Lens Material |
|---|---|---|---|
| 214 | 0.0 | 74.0 (y = 214, x = 504) | |
| 504 | 69.0** | 22.0 (y = 504, x = 506) | SFL57 |
| 506 | 200.0** | 22.0 (y = 506, x = 510) | |
| 510 | −65.0** | 35.0 (y = 510, x = 512) | SFL57 |
| 512 | −56.7** | 66.1 (y = 512, x = 516) | |
| 216 | 0 | | |

*t = distance between positions y and x, wherein x and y are positions in FIG. 2. (?)
**The aspheric coefficients are:
Surface 504: k = −0.6 a4 = 5.0e-7 a6 = −7.0e-11
Surface 506: k = −5.7 a4 = 2.7e-6 a6 = −3.36e-10
Surface 510: k = −4.4 a4 = 2.5e-6 a6 = −2.0e-10
Surface 512: k = −2.4 a4 = 5.5e-7 a6 = 2.3e-10

EXAMPLE 5

Figure 6:
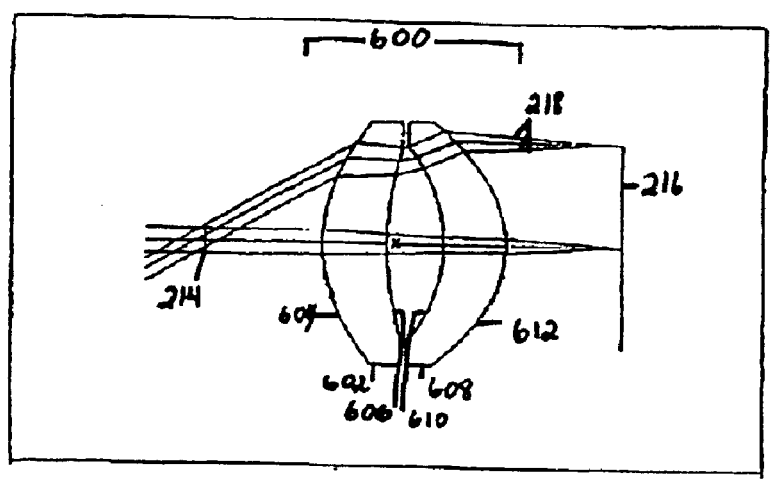
FIG. 6 is another lens unit according to the present invention.

FIG. 6 shows a two-component lens unit 600. Lens unit 600 includes a first lens component 602 and a second lens component 608. The first lens component 602 is made from SFL57. First lens component 602 has a first outside surface 604 and a second outside surface 606. Second lens component 608 is also made from SFL57. Second lens component 608 has a first outside surface 610 and a second outside surface 612.

Lens unit 600 has an effective focal length of 99.9 mm, an F-number of 8.0, and a field-of-view of 60 degrees. The overall length of the holographic storage system from pupil location 214 to image plane 216 is 199 mm. The distance from the pupil location 214 to the vertex of the first outside surface 604 is 70 mm. The thickness of the lens unit from the vertex of surface 604 to the vertex of surface 612 is 87 m. The distance from the vertex of surface 612 to image plane 216 is 55 mm. The characteristics of lens unit 600 are summarized in Table 5.

TABLE 5

Lens Unit 600
Effective Focal Length (EFL) = 99.9 mm
Field of view 2ω = 60 deg
F-number: 8.0   Overall length: 199 mm
(distance from pupil location to image plane)

| Position on FIG. 6 | Radius of curvature R (mm) | Central thickness/ airspace t* (mm) | Lens Material |
|---|---|---|---|
| 214 | 0.0 | 57.0 (y = 214, x = 204) | |
| 604 | 70.0** | 30.0 (y = 604, x = 606) | SFL57 |
| 606 | 175.0* | 27.0 (y = 606, x = 610) | |
| 610 | −75.0 | 30.0 (y = 610, x = 612) | SFL57 |
| 612 | −56.7** | 55.5 (y = 612, x = 616) | |
| 216 | 0 | | |

*t = distance between positions y and x, wherein x and y are positions in FIG 6.
**The aspheric coefficients are:
Surface 604: k = −9.0 a4 = 1.2e-6 a6 = −2.2e-10 a8 = 2.2e-14
Surface 612: k−.3 a4 = −2.2e-7 a6 = 2.1e-10 a8 = 7.3e-15

EXAMPLE 6

Figure 7:
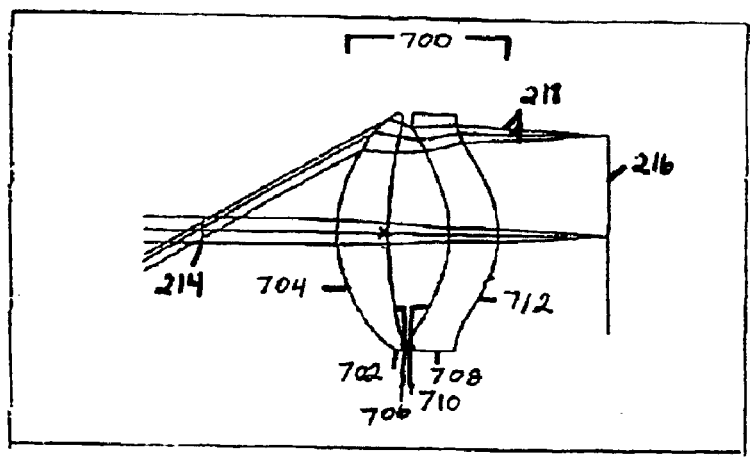
FIG. 7 is another lens unit according to the present invention.

FIG. 7 shows a two-component lens unit 700. Lens unit 700 includes a first lens component 702 and a second lens component 708. The first lens component 702 is made from SFL57. First lens component 702 has a first outside surface 704 and a second outside surface 706. Second lens component 708 is also made from SF6, a lens material available from Schott Glass Technologies, Inc. Second lens component 708 has a first outside surface 710 and a second outside surface 712.

Lens unit 700 has an effective focal length of 100.0 mm, an F-number of 8.0, and a field-of-view of 60 degrees. The overall length of the holographic storage system from pupil location 214 to image plane 216 is 230 mm. The distance from the pupil location 214 to the vertex of the first outside surface 704 is 68 mm. The thickness of the lens unit from the vertex of surface 704 to the vertex of surface 712 is 79 mm. The distance from the vertex of surface 712 to image plane 216 is 52 mm. The characteristics of lens unit 700 are summarized in Table 6

TABLE 6

Lens Unit 700
Effective Focal Length (EFL) = 100.0 mm
Field of view 2ω = 60 deg
F-number: 8.0   Overall length: 230 mm
(distance from pupil location to image plane)

| Position on FIG. 2 | Radius of curvature R (mm) | Central thickness/ airspace t* (mm) | Lens Material |
|---|---|---|---|
| 214 | 0.0 | 67.0 (y = 214, x = 204) | |
| 704 | 68.0** | 25.0 (y = 704, x = 706) | SFL57 |
| 706 | 240.0* | 30.0 (y = 706, x = 710) | |
| 710 | −58.0** | 24.0 (y = 710, x = 712) | SF6 |
| 712 | −52.5** | 52.3 (y = 712, x = 216) | |
| 216 | 0 | | |

*t = distance between positions y and x, wherein x and y are positions in FIG. 7.
**The aspheric coefficients are:
Surface 704: k = −9.0 a4 = 1.4e-6 a6 = −1.8e-10 a8 = 8.0 e-15 a10 = 5.0e-18
Surface 710: k = −4.0 a4 = 5.0e-8 a6 = −2.67e-10 a8 = 6.0e-14
Surface 712: k = −0.9 a4 = 1.0e-7 a6 = 3.0e-10 a8 = 7.0e-15 a10 = −4.0e-18

EXAMPLE 7

Figure 8:
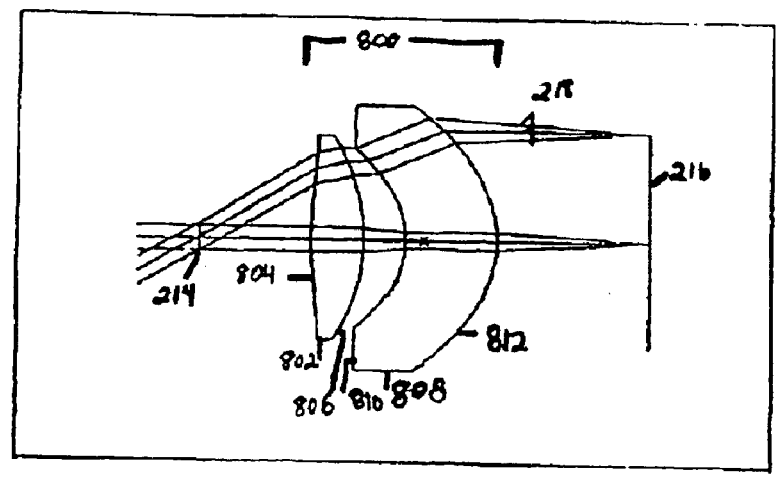
FIG. 8 is another lens unit according to the present invention.

FIG. 8 shows a two-component lens unit 800. Lens unit 800 includes a first lens component 802 and a second lens component 808. The first lens component 802 is made from SFL57. First lens component 802 has a first outside surface 804 and a second outside surface 806. Second lens component 808 is also made from SFL57. Second lens component 808 has a first outside surface 810 and a second outside surface 812.

Lens unit 800 has an effective focal-length of 100.0 mm, an F-number of 8.0, and a field-of-view of 60 degrees. The overall length of the holographic storage system from pupil location 214 to image plane 216 is 218 mm. The distance from the pupil location 214 to the vertex of the first outside surface 804 is 56 mm. The thickness of the lens unit from the vertex of surface 804 to the vertex of surface 812 is 89 mm.

TABLE 7

Lens Unit 800
Effective Focal Length (EFL) = 100.0 mm
Field of view 2ω = 60 deg
F-number: 8.0   Overall length: 196 mm
(distance from pupil location to image plane)

| Position on FIG. 8 | Radius of curvature R (mm) | Central thickness/ airspace t* (mm) | Lens Material |
|---|---|---|---|
| 214 | 0.0 | 56.0 (y = 214, x = 804) | |
| 804 | 206.0** | 25.0 (y = 804, x = 806) | SFL57 |
| 806 | −94.0* | 20.0 (y = 806, x = 810) | |
| 810 | −40.0** | 44.0 (y = 810, x = 812) | SFL57 |
| 812 | −52.5** | 72.6 (y = 812, x = 216) | |
| 216 | 0 | | |

*t = distance between positions y and x, wherein x and y are positions in FIG. 8.
**The aspheric coefficients are:
Surface 804: k = −.7 a4 = −3.8e-7 a6 = −2.5e-11
Surface 810: k = −1.0 a4 = 6.0e-8 a6 = −1.5e-11
Surface 812: k = −0.7 a4 = 3.6e-7 a6 = −1.0e-11

EXAMPLE 8

Figure 9:
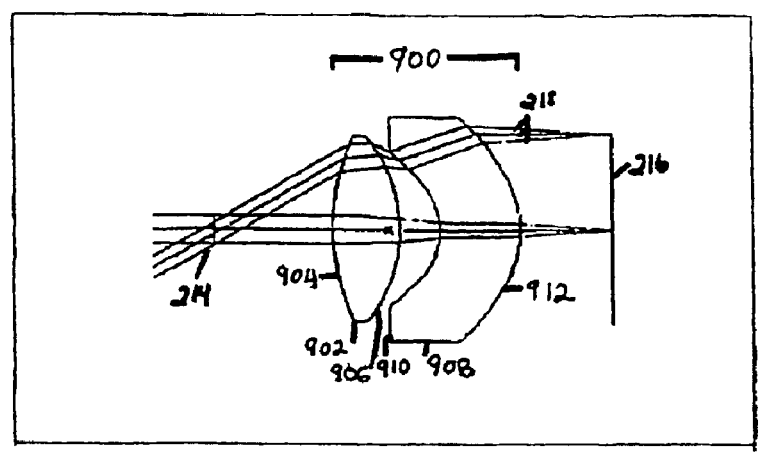
FIG. 9 is another lens unit according to the present invention.

FIG. 9 shows a two-component lens unit 900. Lens unit 900 includes a first lens component 902 and a second lens component 908. The first lens component 902 is made from LAH51, a lens material available from Ohara Corporation. First lens component 902 has a first outside surface 904 and a second outside surface 906. Second lens component 908 is also made from LAH51. Second lens component 908 has a first outside surface 910 and a second outside surface 912.

Lens unit 900 has an effective focal length of 100.0 mm, an F-number of 7.0, and a field-of-view of 60 degrees. The overall length of the holographic storage system from pupil location 214 to image plane 216 is 196 mm. The distance from the pupil location 214 to the vertex of the first outside surface 904 is 60 mm. The thickness of the lens unit from the vertex of surface 904 to the vertex of surface 912 is 92 mm. The distance from the vertex of surface 912 to image plane 216 is 44 mm. The characteristics of lens unit 900 are summarized in Table 8.

TABLE 8

Lens Unit 900
Effective Focal Length (EFL) = 100.0 mm
Field of view 2ω = 60 deg
F-number: 7.0   Overall length: 196 mm
(distance from pupil location to image plane)

| Position on FIG. 9 | Radius of curvature R (mm) | Central thickness/ airspace t* (mm) | Lens Material |
|---|---|---|---|
| 214 | 0.0 | 60.0 (y = 214, x = 904) | |
| 904 | 100.0** | 32.0 (y = 904, x = 906) | LAH51 |
| 906 | −77.0* | 20.6 (y = 906, x = 910) | |
| 910 | −30.0** | 39.0 (y = 910, x = 912) | LAH51 |
| 912 | −51.5** | 44.0 (y = 912, x = 216) | |
| 216 | 0 | | |

*t = distance between positions y and x, wherein x and y are positions in FIG. 9.
**The aspheric coefficients are:
Surface 904: k = −2.6
Surface 910: k = −1.0
Surface 912: k = −1.2 a4 = 2.2e-7 a6 = −6.0e-11

EXAMPLE 9

Figure 10:
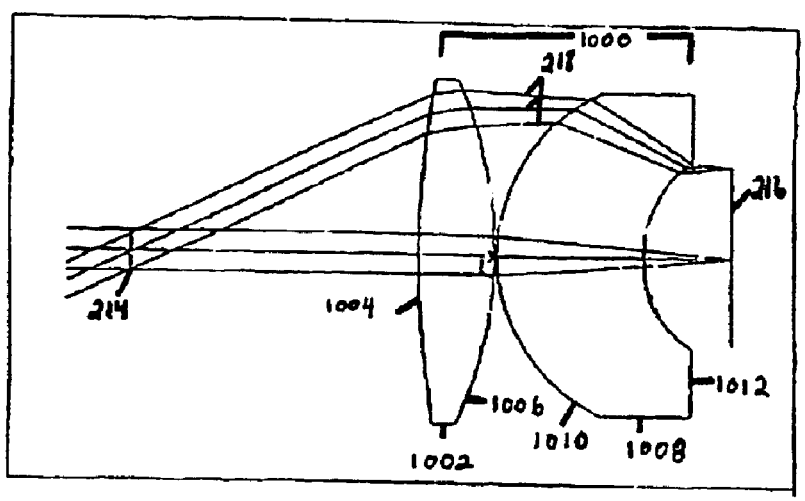
FIG. 10 is another lens unit according to the present invention.

FIG. 10 shows a two-component lens unit 1000. Lens unit 1000 includes a first lens component 1002 and a second lens component 1008. The first lens component 1002 is made from SFL57. First lens component 1002 has a first outside surface 1004 and a second outside surface 1006. Second lens component 1008 is also made from SFL57. Second lens component 1008 has a first outside surface 1010 and a second outside surface 1012.

Lens unit 1000 has an effective focal length of 100.0 mm, an F-number of 5.0, and a field-of-view of 53 degrees. The overall length of the holographic storage system from pupil location 214 to image plane 216 is 275 mm. The distance from the pupil location 214 to the vertex of the first outside surface 1004 is 132 mm. The thickness of the lens unit from the vertex of surface 1004 to the vertex of surface 1012 is 103 mm. The distance from the vertex of surface 1012 to image plane 40 is 66 mm. The characteristics of lens unit 1000 are summarized in Table 9.

TABLE 9

Lens Unit 1000
Effective Focal Length (EFL) = 100.0 mm
Field of view 2ω = 52 deg
F-number: 5.0   Overall length: 275 mm
(distance from pupil location to image plane)

| Position on FIG. 10 | Radius of curvature R (mm) | Central thickness/ airspace t* (mm) | Lens Material |
|---|---|---|---|
| 214 | 0.0 | 132.0 (y = 214, x = 1004) | |
| 1004 | 500.0 | 35.0 (y = 1004, x = 1006) | SLF57 |
| 1006 | −200.0 | 1.0 (y = 1006, x = 1010) | |
| 1010 | 85.6 | 67.2 (y = 1010, x = 1012) | SLF57 |
| 1012 | 63.0** | 40.0 (y = 1012, x = 216) | |
| 216 | 0 | | |

*t = distance between positions y and x, wherein x and y are positions in FIG. 10.
**The aspheric coefficients are:
Surface 1012: k = 0.66 a4 = 7.0e-8

EXAMPLE 10

Figure 11:
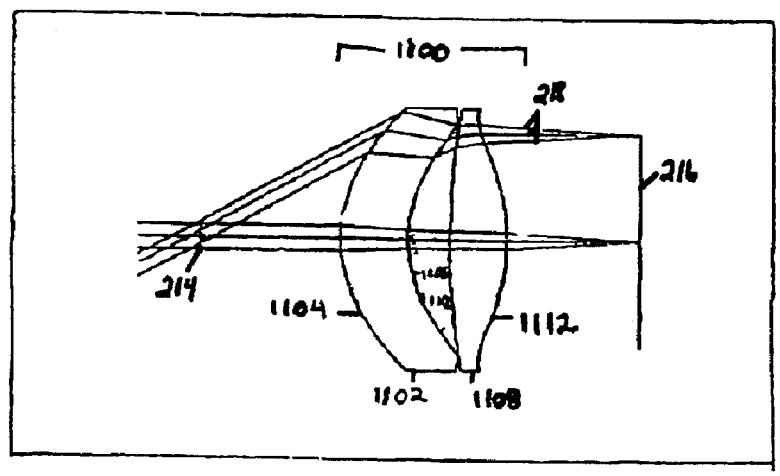
FIG. 11 is another lens unit according to the present invention.

FIG. 11 shows a two-component lens unit 1100. Lens unit 1100 includes a first lens component 1102 and a second lens component 1108. The first lens component 1102 is made from SFL57. First lens component 1102 has a first outside surface 1104 and a second outside surface 1106. Second lens component 1108 is also made from SFL57. Second lens component 1108 has a first outside surface 1110 and a second outside surface 1112.

Lens unit 1100 has an effective focal length of 100.0 mm, an F-number of 8.0, and a field-of-view of 60 degrees. The overall length of the holographic storage system from pupil location 214 to image plane 216 is 207 mm. The distance from the pupil location 214 to the vertex of the first outside surface 104 is 66 mm. The thickness of the lens unit from the vertex of surface 1104 to the vertex of surface 1112 is 79 mm. The distance from the vertex of surface 1112 to image plane 216 is 62 mm. The characteristics of lens unit 1100 are summarized in Table 10. The distance from the vertex of surface 812 to image plane 216 is 73 mm. The characteristics of lens unit 800 are summarized in Table 7.

TABLE 10

Lens Unit 1100
Effective Focal Length (EFL) = 100.0 mm
Field of view 2ω = 60 deg
F-number: 8.0  Overall length: 207 mm
(distance from pupil location to image plane)

| Position on FIG. 11 | Radius of curvature R (mm) | Central thickness/ airspace t* (mm) | Lens Material |
|---|---|---|---|
| 214 | 0.0 | 66.0 (y = 214, x = 1104) | |
| 1104 | 63.3** | 32.0 (y = 1104, x = 1106) | SFL57 |
| 1106 | 65.0** | 20.0 (y = 1106, x = 1110) | |
| 1110 | 400.0 | 27.0 (y = 1110, x = 1112) | SFL57 |
| 1112 | −105.4** | 62.6 (y = 1112, x = 216) | |
| 216 | 0 | | |

*t = distance between positions y and x, wherein x and y are positions in FIG. 11.
**The aspheric coefficients are:
Surface 1104: k = −5.5 a4 = 1.17e-6 a6 = −2.0e-10 a8 = 1.9 e-14
Surface 1106: k = −1.36
Surface 1112: k = −.5 a4 = −4.0e-7 a6 = 2.0e-10

EXAMPLE 11

Figure 12:
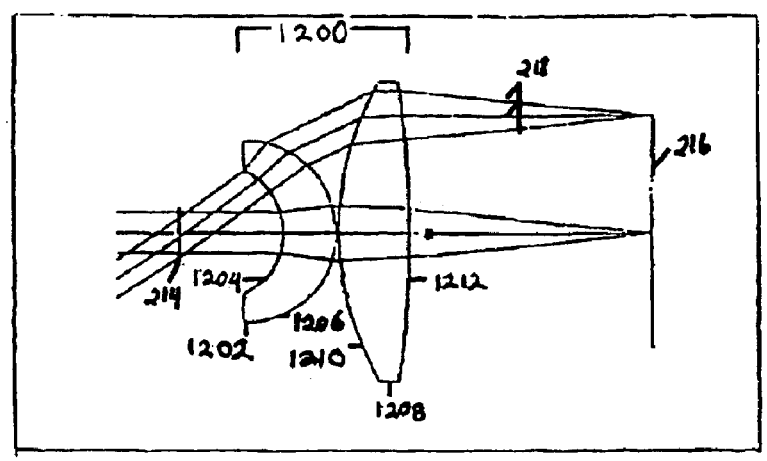
FIG. 12 is another lens unit according to the present invention.

FIG. 12 shows a two-component lens unit 1200. Lens unit 1200 includes a first lens component 1202 and a second lens component 1208. The first lens component 1202 is made from LAH53, a lens material available from Ohara Corporation. First lens component 1202 has a first outside surface 1204 and a second outside surface 1206. Second lens component 1208 is also made from LAH53. Second lens component 1208 has a first outside surface 1210 and a second outside surface 1212.

Lens unit 1200 has an effective focal length of 100.1 mm, an F-number of 5.0, and a field-of-view of 70 degrees. The overall length of the holographic storage system from pupil location 214 to image plane 216 is 232 mm. The distance from the pupil location 214 to the vertex of the first outside surface 1204 is 52 mm. The thickness of the lens unit from the vertex of surface 1204 to the vertex of surface 1212 is 62 mm. The distance from the vertex of surface 1212 to image plane 216 is 118 mm. The characteristics of lens unit 1200 are summarized in Table 11.

TABLE 11

Lens Unit 1200
Effective Focal Length (EFL) = 100.1 mm
Field of view 2ω = 70 deg
F-number: 5.0  Overall length: 232 mm
(distance from pupil location to image plane)

| Position on FIG. 12 | Radius of curvature R (mm) | Central thickness/ airspace t* (mm) | Lens Material |
|---|---|---|---|
| 214 | 0.0 | 52.0 (y = 214, x = 1204) | |
| 1204 | −35.0** | 26.0 (y = 1204, x = 1206) | LAH53 |
| 1206 | −45.6 | 1.0 (y = 1206, x = 1210) | |
| 1210 | 143.0** | 35.0 (y = 1210, x = 1212) | LAH53 |
| 1212 | −500.0 | 117.8 (y = 1212, x = 1216) | |
| 216 | 0 | | |

*t = distance between positions y and x, wherein x and y are positions in FIG. 12.
**The aspheric coefficients are:
Surface 1204: k = 0.2 a4 = −5.0e-8 a6 = 5.0e-11
Surface 1210: k = −1.3 a4 = −1.0e-8 a6 = 1.2e-12

EXAMPLE 12

Figure 13:
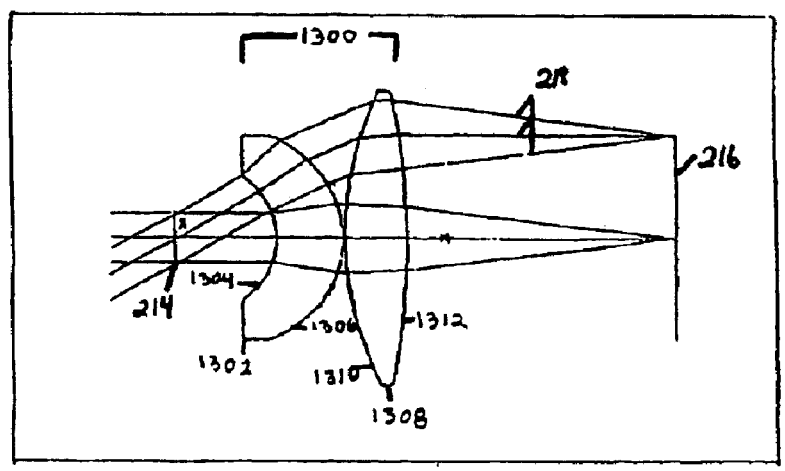
FIG. 13 is another lens unit according to the present invention.

FIG. 13 shows a two-component lens unit 1300. Lens unit 1300 includes a first lens component 1302 and a second lens component 1308. The first lens component 1302 is made from SF6. First lens component 1302 has a first outside surface 1304 and a second outside surface 1306. Second lens component 1308 is also made from SF6. Second lens component 1308 has a first outside surface 1310 and a second outside surface 1312.

Lens unit 1300 has an effective focal length of 100.0 mm, an F-number of 4.0, and a field-of-view of 60 degrees. The overall length of the holographic storage system from pupil location 214 to image plane 216 is 239 mm. The distance from the pupil location 214 to the vertex of the first outside surface 1304 is 50 mm. The thickness of the lens unit from the vertex of surface 1304 to the vertex of surface 1312 is 62 mm. The distance from the vertex of surface 1312 to image plane 216 is 127 mm. The characteristics of lens unit 1300 are summarized in Table 11.

TABLE 12

Lens Unit 1300
Effective Focal Length (EFL) = 100.0 mm
Field of view 2ω = 60 deg
F-number: 4.0  Overall length: 239 mm
(distance from pupil location to image plane)

| Position on FIG. 13 | Radius of curvature R (mm) | Central thickness/ airspace t* (mm) | Lens Material |
|---|---|---|---|
| 214 | 0.0 | 50.0 (y = 214, x = 1304) | |
| 1304 | −37.0 | 31.4 (y = 1304, x = 1306) | SF6 |
| 1306 | −52.1** | 1.0 (y = 1306, x = 1310) | |
| 1310 | 152.0** | 30.0 (y = 1310, x = 1312) | SF6 |
| 1312 | −338.0 | 126.7 (y = 1312, x = 216) | |
| 216 | 0 | | |

*t = distance between positions y and x, wherein x and y are positions in FIG. 13.
**The aspheric coefficients are:
Surface 1306: k = −.08
Surface 1310: k = −2.0

FIG. 14 is a table that summarizes some of the important characteristics of the lenses shown in FIGS. 2–13. All of the characteristics are for lenses that have been scaled to have an effective focal length of 100 mm. All of the lenses are single-component lenses that have one or two lens elements. Lenses 6, 7 and 12 also have aspheric caps. The disclosed lenses have low Petzval curvatures and large pupil distance and back focal lengths.

The sum of the value of the curvatures for the lens units are listed in FIG. 14. As previously described, when the refractive indices of the lens elements are the same, a low Petzval sum will typically require a low sum of the value of the curvatures.

The sum of the absolute values of the curvatures are also give in FIG. 14. The sum of the absolute values of the field curvatures indicates how much effort in terms of curvature it takes to generate optical power without causing a significant Petzval curvature. While a curvature of only about 0.0125 can generate a lens with an EFL of 100 mm, the values for the sum of the absolute values of the curvatures given in FIG. 14 show that about four times as much curvature is typically needed to generate a lens with a 100 mm EFL and a flat-field-of-view.

Having now fully described this invention, it will be appreciated by those skilled in the art that the invention can be performed within a wide range of parameters within what is claimed, without departing from the spirit and scope of the invention.

What is claimed is:

1. A two-component lens unit comprising:

a first lens component and a second lens component, wherein the two-component lens unit has a pupil distance that is at least 30% of EFL, a back focal length that is at least 30% of EFL, and a meniscus shaped lens element with an optical power of between −0.003 and 0.011 when scaled to an EFL of 100 mm, wherein EFL is the effective focal length.

2. The two-component lens unit of claim 1, wherein the two component lens unit is telecentric.

3. The two-component lens unit of claim 1, wherein the two-component lens unit comprises at least one material with a refractive index greater than 1.6.

4. The two-component lens unit of claim 1, wherein the two-component lens unit has a pupil distance that is less than 140% of EFL.

5. The two-component lens unit of claim 1, wherein the two-component lens unit has an axial vertex length of between 45% and 195% of EFL.

6. The two-component lens unit of claim 1, wherein the two component lens unit has a back focal length of less than 140% of EFL.

7. The two-component lens unit of claim 1, wherein the two-component lens unit has a Petzval curvature between −0.007 $mm^{-1}$ and 0.001 $mm^{-1}$ when the two-component lens unit is scaled to have an effective focal length of 100 mm.

8. The two-component lens unit of claim 1, wherein the two-component lens unit has a field-of-view between 45 degrees and 75 degrees.

9. The two-component lens unit of claim 1, wherein the two-component lens unit has an F-number between 4.0 to 16.0.

* * * * *